(12) United States Patent
Wu

(10) Patent No.: US 11,957,036 B2
(45) Date of Patent: Apr. 9, 2024

(54) PEROVSKITE LIGHT-EMITTING DIODE AND METHOD OF MANUFACTURING THE SAME

(71) Applicant: Shenzhen China Star Optoelectronics Semiconductor Display Technology Co., Ltd., Guangdong (CN)

(72) Inventor: Yongwei Wu, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 457 days.

(21) Appl. No.: 17/414,003

(22) PCT Filed: Dec. 23, 2020

(86) PCT No.: PCT/CN2020/138453
§ 371 (c)(1),
(2) Date: Jun. 15, 2021

(87) PCT Pub. No.: WO2021/232783
PCT Pub. Date: Nov. 25, 2021

(65) Prior Publication Data
US 2022/0310982 A1    Sep. 29, 2022

(30) Foreign Application Priority Data
May 19, 2020 (CN) .......................... 202010426149.1

(51) Int. Cl.
H10K 85/50 (2023.01)
H10K 71/00 (2023.01)
(Continued)

(52) U.S. Cl.
CPC ............. *H10K 71/00* (2023.02); *H10K 50/11* (2023.02); *H10K 50/15* (2023.02); *H10K 50/16* (2023.02); *H10K 71/441* (2023.02); *H10K 85/30* (2023.02)

(58) Field of Classification Search
CPC ... H10K 71/10–191; H10K 71/40–441; H10K 71/811; H10K 71/861; H10K 85/30–381
See application file for complete search history.

(56) References Cited

U.S. PATENT DOCUMENTS

| | | | |
|---|---|---|---|
| 2018/0230321 A1* | 8/2018 | Pan | ........................ C09D 11/30 |
| 2019/0189363 A1 | 7/2019 | Tsang et al. | |

FOREIGN PATENT DOCUMENTS

| | | |
|---|---|---|
| CN | 106450009 | 2/2017 |
| CN | 109686841 | 4/2019 |

(Continued)

OTHER PUBLICATIONS

"Simultaneous performance and stability improvement of perovskite solar cells by a sequential twice anti-solvent deposition process" by Mingxi Tan et al., in Organic Electronics 59 (2018) 358-365 (Year: 2018).*

(Continued)

*Primary Examiner* — Eric A. Ward

(57) ABSTRACT

A perovskite light-emitting diode and a method of manufacturing the same are provided. The method includes steps of providing a substrate, disposing a first electrode layer, a hole transport layer, and a perovskite precursor liquid layer on the substrate, coating the perovskite precursor liquid layer with a first solvent, performing a first thermal process to form a perovskite prefabricated layer, coating the perovskite prefabricated layer with a second solvent, and performing a second thermal process to form a perovskite light-emitting layer.

16 Claims, 1 Drawing Sheet

(51) Int. Cl.
    *H10K 50/11*     (2023.01)
    *H10K 50/15*     (2023.01)
    *H10K 50/16*     (2023.01)
    *H10K 71/40*     (2023.01)
    *H10K 85/30*     (2023.01)

(56) References Cited

FOREIGN PATENT DOCUMENTS

| | | |
|---|---|---|
| CN | 110459686 | 11/2019 |
| CN | 111613737 | 9/2020 |

OTHER PUBLICATIONS

"Improved Performance and Stability of All-Inorganic Perovskite Light-Emitting Diodes by Antisolvent Vapor Treatment" by Chen Wu et al. in Adv. Funct. Mater. 2014, 27, 1700338, (Year: 2014).*

"Optimization of anti-solvent engineering toward high performance perovskite solar cells" by Jian Li et al. in Journal of Materials Research, vol. 34, Issue 14, Jul. 28, 2019, pp. 2416-2424, (Year: 2019).*

"Greener, Nonhalogenated Solvent Systems for Highly Efficient Perovskite Solar Cells" by Mozhgan Yavari et al. in Advanced Energy Materials, vol. 8, Issue 21, Jul. 25, 2018, 1800177, (Year: 2018).*

\* cited by examiner

PEROVSKITE LIGHT-EMITTING DIODE AND METHOD OF MANUFACTURING THE SAME

RELATED APPLICATIONS

This application is a National Phase of PCT Patent Application No. PCT/CN2020/138453 having International filing date of Dec. 23, 2020, which claims the benefit of priority of Chinese Patent Application No. 202010426149.1 filed on May 19, 2020. The contents of the above applications are all incorporated by reference as if fully set forth herein in their entirety.

FIELD AND BACKGROUND OF THE INVENTION

The present disclosure relates to the technical field of light-emitting diodes, and particularly, to a perovskite light-emitting diode panel and a method of manufacturing the same.

Due to high efficiency, high brightness, and high color purity properties of perovskite materials, the perovskite materials are widely used in the fields of optoelectronic devices, such as solar cells, displays and lighting, lasers, and detectors. However, due to the presence of unstable ion states at the grain boundaries of the perovskite film, there are a large number of defects on a surface of the perovskite film, resulting in a decrease in the crystal regularity and controllability of the perovskite film. Therefore, it is necessary to provide a method to enhance the regularity and controllability of the perovskite film.

The present disclosure provides a perovskite light-emitting diode and a method of manufacturing the same to solve problems of the regularity and controllability of the perovskite film.

SUMMARY OF THE INVENTION

The present disclosure provides a method of manufacturing a perovskite light-emitting diode, and the method comprises:
  providing a substrate;
  disposing a first electrode layer on the substrate, wherein the first electrode layer is formed by vacuum evaporation;
  disposing a hole transport layer on the first electrode layer;
  disposing a perovskite precursor liquid layer on the hole transport layer;
  coating the perovskite precursor liquid layer with a first solvent, performing a first thermal process on the perovskite precursor liquid layer coated with the first solvent, and allowing the perovskite precursor liquid layer to form a perovskite prefabricated layer;
  coating the perovskite prefabricated layer with a second solvent, performing a second thermal process on the perovskite prefabricated layer coated with the second solvent, and allowing the perovskite prefabricated layer to form a perovskite light-emitting layer; and
  disposing an electron transport layer and a second electrode layer sequentially on the perovskite light-emitting layer.

In the method of manufacturing the perovskite light-emitting diode provided by the provided in the present disclosure, the first solvent comprises one of toluene, chlorobenzene, anisole, and acetone or any combination thereof.

In the method of manufacturing the perovskite light-emitting diode provided by the provided in the present disclosure, the second solvent comprises one of ethanol, isopropanol, and n-hexane or any combination thereof.

In the method of manufacturing the perovskite light-emitting diode provided by the provided in the present disclosure, a material of the hole transport layer comprises one of poly(3,4-ethylenedioxythiophene):poly(styrenesulfonate) (PEDOT:PSS), NiO, and $MoO_3$ or any combination thereof.

In the method of manufacturing the perovskite light-emitting diode provided by the provided in the present disclosure, a material of the electron transport layer comprises one of 1,3,5-Tris(1-phenyl-1H-benzimidazol-2-yl)benzene (TPBi), 4,6-bis(3,5-di(pyridin-3-yl)phenyl)-2-methylpyrimidine ($B_3$PYMPM), bathocuproine (BCP), $SnO_2$, and $TiO_2$ or any combination thereof.

In the method of manufacturing the perovskite light-emitting diode provided by the provided in the present disclosure, materials of the first electrode layer and the second electrode layer comprise one of Al, ITO, Mg, and Ag or any combination thereof.

In the method of manufacturing the perovskite light-emitting diode provided by the provided in the present disclosure, temperatures of the first thermal process and the second thermal process range from 60° C. to 120° C.

In the method of manufacturing the perovskite light-emitting diode provided by the provided in the present disclosure, durations for the first thermal process and the second thermal process range from 10 minutes to 120 minutes.

In the method of manufacturing the perovskite light-emitting diode provided by the provided in the present disclosure, atmospheres of the first thermal process and the second thermal process comprise one of helium, neon, argon, krypton, and xenon or any combination thereof.

The present disclosure further provides a method of manufacturing a perovskite light-emitting diode, and the method comprises:
  providing a substrate;
  disposing a first electrode layer on the substrate;
  disposing a hole transport layer on the first electrode layer;
  disposing a perovskite precursor liquid layer on the hole transport layer;
  coating the perovskite precursor liquid layer with a first solvent, performing a first thermal process on the perovskite precursor liquid layer coated with the first solvent, and allowing the perovskite precursor liquid layer to form a perovskite prefabricated layer;
  coating the perovskite prefabricated layer with a second solvent, performing a second thermal process on the perovskite prefabricated layer coated with the second solvent, and allowing the perovskite prefabricated layer to form a perovskite light-emitting layer; and
  disposing an electron transport layer and a second electrode layer sequentially on the perovskite light-emitting layer.

In the method of manufacturing the perovskite light-emitting diode provided by the provided in the present disclosure, the first solvent comprises one of toluene, chlorobenzene, anisole, and acetone or any combination thereof.

In the method of manufacturing the perovskite light-emitting diode provided by the provided in the present disclosure, the second solvent comprises one of ethanol, isopropanol, and n-hexane or any combination thereof.

In the method of manufacturing the perovskite light-emitting diode provided by the provided in the present disclosure, a material of the hole transport layer comprises one of PEDOT:PSS, NiO, and $MoO_3$ or any combination thereof.

In the method of manufacturing the perovskite light-emitting diode provided by the provided in the present disclosure, a material of the electron transport layer comprises one of TPBi, $B_3$PYMPM, BCP, $SnO_2$, and $TiO_2$ or any combination thereof.

In the method of manufacturing the perovskite light-emitting diode provided by the provided in the present disclosure, materials of the first electrode layer and the second electrode layer comprise one of Al, ITO, Mg, and Ag or any combination thereof.

In the method of manufacturing the perovskite light-emitting diode provided by the provided in the present disclosure, temperatures of the first thermal process and the second thermal process range from 60° C. to 120° C.

In the method of manufacturing the perovskite light-emitting diode provided by the provided in the present disclosure, durations for the first thermal process and the second thermal process range from 10 minutes to 120 minutes.

In the method of manufacturing the perovskite light-emitting diode provided by the provided in the present disclosure, atmospheres of the first thermal process and the second thermal process comprise one of helium, neon, argon, krypton, and xenon or any combination thereof.

The present disclosure further provides a perovskite light-emitting diode, and the perovskite light-emitting diode comprises:
- a substrate;
- a first electrode layer disposed on the substrate;
- a hole transport layer disposed on the first electrode layer;
- a perovskite light-emitting layer disposed on the hole transport layer;
- an electron transport layer disposed on the perovskite light-emitting layer; and
- a second electrode layer disposed on the electron transport layer.

The present disclosure provides a perovskite light-emitting diode and a method of manufacturing the same. The method of manufacturing the perovskite light-emitting diode comprises steps of: providing a substrate, disposing a first electrode layer on the substrate, disposing a hole transport layer on the first electrode layer, disposing a perovskite precursor liquid layer on the hole transport layer, coating the perovskite precursor liquid layer with a first solvent, performing a first thermal process on the perovskite precursor liquid layer coated with the first solvent, and allowing the perovskite precursor liquid layer to form a perovskite prefabricated layer, coating the perovskite prefabricated layer with a second solvent, performing a second thermal process on the perovskite prefabricated layer coated with the second solvent, allowing the perovskite prefabricated layer to form a perovskite light-emitting layer, and disposing an electron transport layer and a second electrode layer sequentially on the perovskite light-emitting layer. In the present disclosure, the perovskite light-emitting layer is prepared by the twice anti-solvent methods, which delay the crystallization process and enhance the regularity and controllability of the crystallization, and thereby enhancing the light-emitting efficiency of the perovskite light-emitting diode.

BRIEF DESCRIPTION THE SEVERAL VIEWS OF THE DRAWINGS

In order to explain the technical solutions of the present disclosure more clearly, the following will briefly introduce the drawings used in the description of the embodiments or the related art. Obviously, the drawings described below are only some embodiments of the present disclosure. For those skilled in the art, other drawings can be obtained based on these drawings without making creative efforts.

DESCRIPTION OF SPECIFIC EMBODIMENTS OF THE INVENTION

The technical solutions of the present disclosure will be described clearly and completely in combined with the drawings of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

Figure 1:
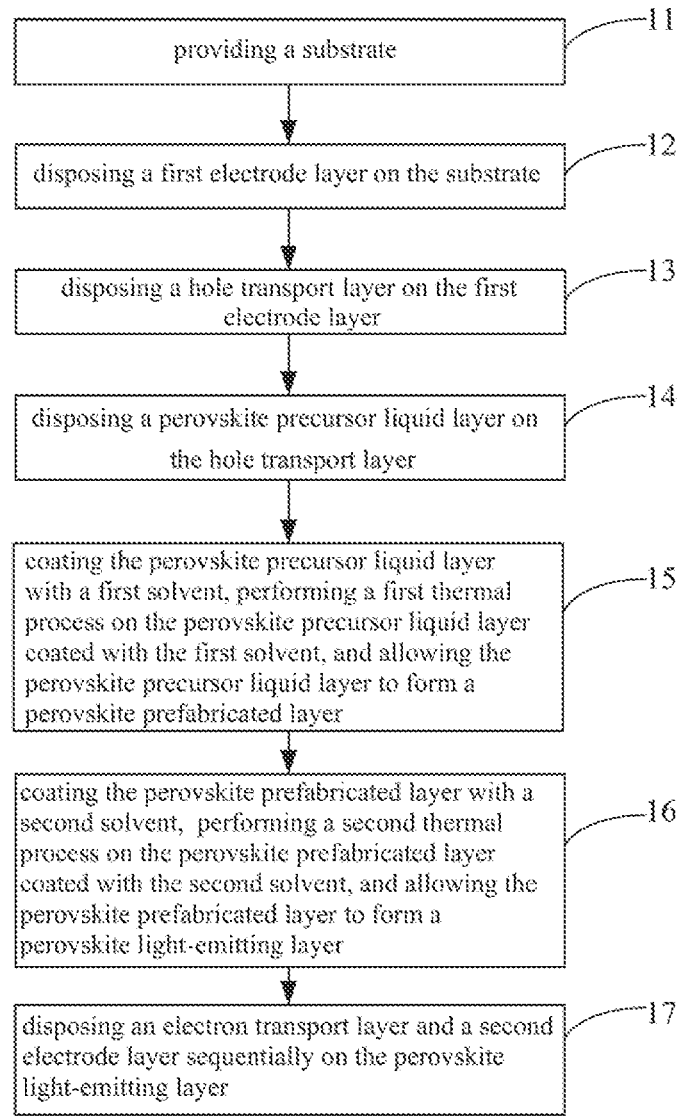
FIG. 1 is a flow chart of a method of manufacturing a perovskite light-emitting diode provided by the present disclosure.
Figure 2:
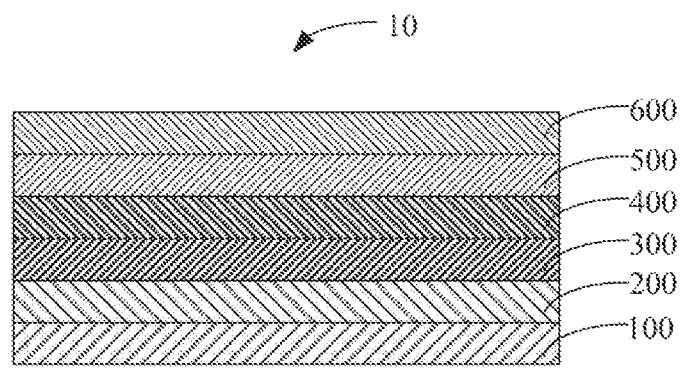
FIG. 2 is a schematic structural view of the perovskite light-emitting diode provided by the present disclosure.

Referring to FIG. 1 and FIG. 2, the present disclosure provides a method of manufacturing a perovskite light-emitting diode, and the method comprises the following steps.

In step 11, a substrate 100 is provide, and the substrate 100 may be a glass substrate or a flexible substrate.

In step 12, a first electrode layer is disposed on the substrate 100, and a first electrode layer material is disposed on the substrate 100 by vacuum evaporation to form a first electrode layer 200. The first electrode layer material comprises one of Al, ITO, Mg, and Ag or any combination thereof.

In step 13, a hole transport layer 300 is disposed on the first electrode layer 200, and a hole transport layer material is spin-coated on the first electrode layer 200 by a solution spin-coating process to form the hole transport layer 300. The hole transport layer material is one of PEDOT:PSS, NiO, $MoO_3$, polyvinylcarbazole, 1,1-bis[4-[N,N-bis(p-tolyl)amino]phenyl]cyclohexane, and poly[[(4-butylphenyl)imino][1,1'-biphenyl]] or any combination thereof.

In step 14, a perovskite precursor liquid layer 410 is disposed on the hole transport layer 300. The perovskite precursor liquid layer 410 is spin-coated on the hole transport layer 300 by a solution spin-coating process to form the perovskite precursor liquid layer 410. A spin-coating speed ranges from 3100 rpm to 4900 rpm, and spin-coating duration ranges from 30 seconds to 110 seconds. In some embodiments, the spin-coating speed is 3500 rpm, 3800 rpm, 4000 rpm, 4500 rpm, 4800 rpm, etc. In some embodiments, the spin-coating duration may be 40 seconds, 60 seconds, 90 seconds, 105 seconds, etc.

The perovskite precursor liquid comprises lead bromide, methyl amine bromide, formamidine amine bromide, and phenethyl amine bromide. The molar ratio of the lead bromide, the methyl amine bromide, the formamidine amine bromide, and the phenethyl amine bromide is 1:x:(1−x):(0.1 to 0.7), and a range of x value is from 0 to 1. The lead bromide, the methyl amine bromide, the formamidine amine bromide, and the phenethyl amine bromide are dissolved in a polar solvent to form a perovskite precursor solution. The polar solvent comprises one of N,N-dimethylformamide, dimethylsulfoxide, formamide, trifluoroacetic acid, acetonitrile, hexamethylphosphoramide, methanol, ethanol, acetic acid, and isopropanol or any combination thereof.

In step 15. The perovskite precursor liquid layer 410 is coated with a first solvent, and a first thermal process is performed on the perovskite precursor liquid layer 410 coated with the first solvent, allowing the perovskite precursor liquid layer 410 to form a perovskite prefabricated layer 420.

After spin-coating the first solvent on the perovskite precursor liquid layer 410, a first thermal process is performed on the perovskite precursor liquid layer 410 at 60° C. to 120° C. for 10 minutes to 120 minutes, allowing the perovskite precursor liquid layer 410 to form a perovskite prefabricated layer 420. The first solvent comprises one of toluene, chlorobenzene, anisole, and acetone or any combination thereof. A spin-coating speed of the first solvent ranges from 3100 rpm to 4900 rpm. In some embodiments, the spin-coating speed may be 3300 rpm, 3600 rpm, 4000 rpm, 4100 rpm, 4600 rpm, etc. The spin-coating duration of the first solvent ranges from 21 seconds to 45 seconds. In some embodiments, the first spin-coating duration of the solvent may be 23 seconds, 28 seconds, 35 seconds, 42 seconds, etc. In some embodiments, temperature of the first thermal process may be 70° C., 85° C., 98° C., 112° C., etc. In some embodiments, a process duration of the first thermal process may be 20 minutes, 60 minutes, 90 minutes, 100 minutes, etc. An atmosphere of the first thermal process comprises one of helium, neon, argon, krypton, and xenon or any combination thereof.

In step 16. The perovskite prefabricated layer 420 is coated with a second solvent, and a second thermal process is performed on the perovskite prefabricated layer 420 coated with the second solvent, allowing the perovskite prefabricated layer 420 to form a perovskite light-emitting layer 400.

The perovskite prefabricated layer 420 is spin-coated with the second solvent at a spin-coating speed of between 3100 rpm and 4900 rpm, and the spin-coating duration ranges from 21 seconds to 45 seconds. After the spin-coating is completed, a second thermal process is performed, allowing the perovskite prefabricated layer 420 to form the perovskite light-emitting layer 400. The second solvent comprises one of ethanol, isopropanol, and n-hexane or any combination thereof. In some embodiments, the spin-coating speed may be 3300 rpm, 3600 rpm, 4000 rpm, 4100 rpm, 4600 rpm, etc. In some embodiments, the spin-coating duration of the second solvent may be 23 seconds, 28 seconds, 35 seconds, 42 seconds, etc. In some embodiments, temperature of the second thermal process may be 70° C., 85° C., 98° C., 112° C., etc. In some embodiments, a process duration of the second thermal process may be 20 minutes, 60 minutes, 90 minutes, 100 minutes, etc. An atmosphere of the second thermal process comprises one of helium, neon, argon, krypton, and xenon or any combination thereof.

In step 17, an electron transport layer 500 and a second electrode layer 600 are disposed sequentially on the perovskite light-emitting layer 400.

An electron transport layer material is disposed on the perovskite light-emitting layer 400 by a vacuum evaporation method to form the electron transport layer 500. The electron transport layer material comprises one of TPBi, B$_3$PYMPM, BCP, SnO$_2$, and TiO$_2$ or any combination thereof.

A second electrode material is disposed on the electron transport layer 500 by a vacuum evaporation method to form the second electrode layer 600. The material of the second electrode layer comprises one of Al, ITO, Mg, and Ag or any combination thereof.

In the present disclosure, the method of manufacturing the perovskite light-emitting diode is performed by twice anti-solvent methods to obtain the perovskite light-emitting layer, which delay the crystallization process and enhance the regularity and controllability of the crystallization, and thereby enhancing the light-emitting efficiency of the perovskite light-emitting diode.

Please refer to FIG. 2. FIG. 2 is a schematic structural view of the perovskite light-emitting diode provided by the present disclosure. The present disclosure further provides a perovskite light-emitting diode 10. The perovskite light-emitting diode 10 comprises a substrate 100, a first electrode layer 200, a hole transport layer 300, a perovskite light-emitting layer 400, an electron transport layer 500, and a second electrode layer 600.

The first electrode layer 200 is disposed on the substrate 100. A material of the first electrode layer 200 comprises one of Al, ITO, Mg, and Ag or any combination thereof. The hole transport layer 300 is disposed on the first electrode layer 200. A material of the hole transport layer 300 comprises one of PEDOT:PSS, NiO and MoO$_3$, polyvinylcarbazole, 1,1-bis[4-[N,N-bis(p-tolyl)amino]phenyl]cyclohexane, and poly [[(4-butylphenyl)imino][1,1'-biphenyl]] or any combination thereof. The perovskite light-emitting layer 400 is disposed on the hole transport layer 300. The electron transport layer 500 is disposed on the perovskite light-emitting layer 400. A material of the electron transport layer 500 comprises one of TPBi, B$_3$PYMPM, BCP, SnO$_2$, and TiO$_2$ or any combination thereof. The second electrode layer 600 is disposed on the electron transport layer 500. A material of the second electrode layer 600 comprises one of Al, ITO, Mg, and Ag or any combination thereof.

The present disclosure provides the perovskite light-emitting diode and the method of manufacturing the same. The perovskite light-emitting diode is prepared into a perovskite light-emitting layer by twice anti-solvent methods to obtain the perovskite light-emitting layer, which delay the crystallization process and enhance the regularity and controllability of the crystallization, and thereby enhancing the light-emitting efficiency of the perovskite light-emitting diode.

The above are only examples of the present disclosure, and do not limit the scope of the present disclosure. Any equivalent structure or equivalent process modification using the content of the specification and drawings of the present disclosure, or directly or indirectly applied to other related technical fields is included in the claimed scope of the present disclosure.

What is claimed is:

1. A method of manufacturing a perovskite light-emitting diode, comprising steps of:
   providing a substrate;
   disposing a first electrode layer on the substrate, wherein the first electrode layer is formed by vacuum evaporation;
   disposing a hole transport layer on the first electrode layer;
   disposing a perovskite precursor liquid layer on the hole transport layer;
   coating the perovskite precursor liquid layer with a first solvent, performing a first thermal process on the perovskite precursor liquid layer coated with the first solvent, and allowing the perovskite precursor liquid layer to form a perovskite prefabricated layer;
   coating the perovskite prefabricated layer with a second solvent, performing a second thermal process on the perovskite prefabricated layer coated with the second solvent, and allowing the perovskite prefabricated layer to form a perovskite light-emitting layer; and disposing an electron transport layer and a second electrode layer sequentially on the perovskite light-emitting layer;

wherein durations for the first thermal process and the second thermal process range from 10 minutes to 120 minutes.

2. The method of manufacturing the perovskite light-emitting diode according to claim 1, wherein the first solvent comprises one of toluene, chlorobenzene, anisole, and acetone or any combination thereof.

3. The method of manufacturing the perovskite light-emitting diode according to claim 1, wherein the second solvent comprises one of ethanol, isopropanol, and n-hexane or any combination thereof.

4. The method of manufacturing the perovskite light-emitting diode according to claim 1, wherein a material of the hole transport layer comprises one of PEDOT:PSS, NiO, and $MoO_3$ or any combination thereof.

5. The method of manufacturing the perovskite light-emitting diode according to claim 1, wherein a material of the electron transport layer comprises one of TPBi, $B_3$PYMPM, BCP, $SnO_2$, and $TiO_2$ or any combination thereof.

6. The method of manufacturing the perovskite light-emitting diode according to claim 1, wherein materials of the first electrode layer and the second electrode layer comprise one of Al, ITO, Mg, and Ag or any combination thereof.

7. The method of manufacturing the perovskite light-emitting diode according to claim 1, wherein temperatures of the first thermal process and the second thermal process range from 60° C. to 120° C.

8. The method of manufacturing the perovskite light-emitting diode according to claim 1, wherein atmospheres of the first thermal process and the second thermal process comprise one of helium, neon, argon, krypton, and xenon or any combination thereof.

9. A method of manufacturing a perovskite light-emitting diode, comprising steps of:
providing a substrate;
disposing a first electrode layer on the substrate;
disposing a hole transport layer on the first electrode layer;
disposing a perovskite precursor liquid layer on the hole transport layer;
coating the perovskite precursor liquid layer with a first solvent, performing a first thermal process on the perovskite precursor liquid layer coated with the first solvent, and allowing the perovskite precursor liquid layer to form a perovskite prefabricated layer;

coating the perovskite prefabricated layer with a second solvent, performing a second thermal process on the perovskite prefabricated layer coated with the second solvent, and allowing the perovskite prefabricated layer to form a perovskite light-emitting layer; and disposing an electron transport layer and a second electrode layer sequentially on the perovskite light-emitting layer;

durations for the first thermal process and the second thermal process range from 10 minutes to 120 minutes.

10. The method of manufacturing the perovskite light-emitting diode according to claim 9, wherein the first solvent comprises one of toluene, chlorobenzene, anisole, and acetone or any combination thereof.

11. The method of manufacturing the perovskite light-emitting diode according to claim 9, wherein the second solvent comprises one of ethanol, isopropanol, and n-hexane or any combination thereof.

12. The method of manufacturing the perovskite light-emitting diode according to claim 9, wherein a material of the hole transport layer comprises one of PEDOT:PSS, NiO, and $MoO_3$ or any combination thereof.

13. The method of manufacturing the perovskite light-emitting diode according to claim 9, wherein a material of the electron transport layer comprises one of TPBi, $B_3$PYMPM, BCP, $SnO_2$, and $TiO_2$ or any combination thereof.

14. The method of manufacturing the perovskite light-emitting diode according to claim 9, wherein materials of the first electrode layer and the second electrode layer comprise one of Al, ITO, Mg, and Ag or any combination thereof.

15. The method of manufacturing the perovskite light-emitting diode according to claim 9, wherein temperatures of the first thermal process and the second thermal process range from 60° C. to 120° C.

16. The method of manufacturing the perovskite light-emitting diode according to claim 9, wherein atmospheres of the first thermal process and the second thermal process comprise one of helium, neon, argon, krypton, and xenon or any combination thereof.

* * * * *